United States Patent [19]
Kim et al.

[11] Patent Number: 5,935,741
[45] Date of Patent: *Aug. 10, 1999

[54] METHOD FOR FORMING A COLOR FILTER

[75] Inventors: Won-ho Kim; Dong-uk Choi, both of Suwon, Rep. of Korea

[73] Assignee: Samsung Electronics Co., Ltd., Kyungki, Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 08/611,551

[22] Filed: Mar. 6, 1996

Related U.S. Application Data

[63] Continuation of application No. 08/165,808, Dec. 14, 1993, abandoned.

[30] Foreign Application Priority Data

Dec. 14, 1992 [KR] Rep. of Korea ........................ 92-24134

[51] Int. Cl.[6] ........................................................ G03F 9/00
[52] U.S. Cl. .................................. 430/7; 430/22; 430/322
[58] Field of Search .................................. 430/22, 7, 322

[56] References Cited

U.S. PATENT DOCUMENTS

| | | | |
|---|---|---|---|
| 4,343,878 | 8/1982 | Chiang | 430/22 |
| 4,777,117 | 10/1988 | Murata et al. | 430/22 |
| 5,212,028 | 5/1993 | Fujino | 430/22 |
| 5,262,257 | 11/1993 | Fukuda et al. | 430/5 |
| 5,422,207 | 6/1995 | Yoda et al. | 430/7 |

*Primary Examiner*—Maria Nuzzolillo
*Assistant Examiner*—Laura Weiner
*Attorney, Agent, or Firm*—Pillsbury Madison & Sutro LLP

[57] ABSTRACT

A color filter having patterns for aligning a mask and a method of manufacturing the same. An align key pattern causes a step difference in height of an overlaid resist layer which, in turn, diffracts a laser beam. The diffracted light is detected to generate an alignment signal to which a mask for exposing the subsequent resist layer is aligned.

6 Claims, 5 Drawing Sheets

METHOD FOR FORMING A COLOR FILTER

This is a continuation of application Ser. No. 08/165,808, filed on Dec. 14, 1993, which was abandoned upon the filling hereof.

FIELD OF THE INVENTION

The present invention relates to a color filter for a liquid crystal display device and a method for manufacturing the same which includes a pattern for aligning a mask during a photolithography process.

BACKGROUND

A color liquid crystal display device is used to display an image, and this kind of device comprises two substrates, one that has a number of transparent scanning electrodes and another that has signal electrodes which face the scanning electrodes. A liquid crystal is provided between the two substrates, and a polarizing plate is provided on the outside of the two substrates. A color filter dyed in primary colors such as red, green and blue is provided with the above scanning electrodes. Further, the color filter is applied to an active matrix liquid crystal display wherein a thin film transistor is used as an active device. The crossing point of the scanning electrode and the signal electrode forms a pixel, and an adjacent three pixels constitute one component of a color image.

The color filter is formed on the transparent signal electrode which, in turn, is formed on the respective substrate. This kind of color filter is obtained by coating a colored base-material layer comprised of proteins such as casein or gelatine and then patterning the layer. The base material of the color filter is dielectric, and the liquid crystal is located between the color filter and the scanning electrode.

For this kind of color filter, a color pattern should be accurately formed for each color so that each color pixel is aligned with respective electrodes. Accordingly, a photolithography process should be performed after applying each colored, base-material layer.

In a method for manufacturing a conventional color filter, an align key pattern is formed on the substrate using chrome (Cr), and then a color resist layer is formed over the align key pattern. Then, using a laser beam and the align key pattern as a target, a mask is auto-aligned by moving the substrate. The color resist layer is then patterned by a conventional photolithography process.

FIG. 1 to FIG. 3 are cross-sectional views of the align key pattern regions used for forming red, green and blue resist patterns of the color filter according to a conventional method. Reference numeral 11 is a substrate, and reference numeral 12 is an align key pattern. Reference numeral 13 is a red resist layer, reference numeral 14 is a green resist layer, and reference numeral 15 is a blue resist layer. Reference numeral 16 is an anti-oxidative film, and reference numeral 17 is a laser beam. Each section of FIG. 1 to FIG. 3 has the same structure but for a different color layer 13–15. The conventional align key pattern and method for forming a color pattern using the same will be described below with reference to FIG. 1. It should be understood that the process will be similar for the other color layers of FIG. 2 and FIG. 3.

First, a chrome layer is deposited on substrate 11 to a thickness of approximately 1,500 Å, and then patterned using a conventional photolithography process to form align key pattern 12. Then, red resist layer 13 is formed, followed by anti-oxidative film 16. A mask for exposing red resist layer 13 is auto-aligned using a laser beam 17 whose wavelength is about 633 nm and align key pattern 12 as a target. Thereafter, red resist layer 13 is patterned via a conventional photolithography process, thereby forming a red color pattern.

Further, another mask is aligned using chrome, align key pattern 12 as a target, and then green and blue color patterns (FIG. 2 and FIG. 3) can be formed using the same manufacturing method as above. However, green and blue resists layers 14 and 15 have a very low (almost zero) transmittance of a 633 nm laser beam. FIG. 11 is a graphical representation showing the transmittance of a blue, green and red resists according to the wavelength of the laser beam. In FIG. 11, reference numeral 31 indicates the transmittance of a blue resist layer as a function of wavelength. Reference numeral 32 indicates the transmittance of a green resist layer, and reference numeral 33 indicates the transmittance of a red resist layer. When a green or blue color resist layer is formed, the light of the laser beam is not transmitted through the resist layer and cannot be sensed. The auto-aligner device has difficulty detecting the align key pattern. Auto-alignment is possible for the red color resist layer 13, whose transmittance of a 633 nm wavelength laser beam is above 90%, since the laser beam is reflected at the align key pattern and can be easily detected. However, the transmittance of the laser beam for green and blue resist layers 14 and 15 is almost zero for the above wavelength (much lower than that of the red resist). In addition to this, the chrome, align key pattern is thin and therefore, most of the remaining light is absorbed when the align key pattern is used. As a result, insufficient light is barely reflected from the align key pattern.

FIG. 4 is a plan view showing the align key pattern formed on the substrate and the align key pattern formed on a mask according to the conventional method. FIG. 5 shows the waveform diagrams detected from the light reflected from the align key pattern shown in FIG. 4.

In FIG. 4, $a_1$, $c_1$, $a_2$ and $c_2$ indicate the align key pattern formed on a substrate, and $b_1$ and $b_2$ indicate the align key pattern formed on the mask. As shown in FIG. 4, the laser beam reflected from align key pattern $b_1$ and $b_2$ on the mask is detected and aligned at the center of the align key patterns formed on the substrate. FIG. 5 shows waveform diagrams obtained from a group of align key patterns $a_1$, $b_1$, $c_1$ and $a_2$, $b_2$, $c_2$ of FIG. 4 using an oscilloscope when the mask is aligned. Waveform (a) shows the case when a red resist layer is formed, and waveform (b) shows the case when the blue or green resist is formed. As is shown in FIG. 5, it is difficult to perform an alignment process when the blue or green resist layer is formed, since the reflected wave is barely detected. Accordingly, the color resist layer over the align key pattern should be removed in order to perform auto-alignment of a mask. For this, an align key should be exposed manually by scrubbing the upper part of the key pattern using solvent (such as acetone or a developer) to remove a portion of the color resist layer over the align key pattern. However, this manual operation reduces productivity and yield.

SUMMARY OF THE INVENTION

An object of the invention is to improve productivity of color filters for liquid crystal displays.

Another object is to automate alignment of photolithography masks to a substrate.

A further object is to improve a method for aligning a photolithography mask to a substrate using a laser light having a wavelength that is absorbed by materials on the substrate.

A still further object is to provide a method for aligning a photolithography mask to a substrate that does not depend on passing light through a color filter material on the substrate surface.

These and other objects are achieved by applying a photoresist material over an alignment key pattern such that a step-region of the photoresist layer changes height at the location of the align key pattern. When illuminated by a laser light of a color that would otherwise be absorbed, the change in height reflects or diffracts the laser light and provides a detectible indication of the location of the underlying alignment key pattern.

In a process that sequentially applies multiple layers of resist material, resist material for one layer may be patterned to provide an alignment key for a subsequent pattern.

BRIEF DESCRIPTION OF THE DRAWINGS

The above objects and other advantages of the present invention will become more apparent by describing in detail a preferred embodiment thereof with reference to the attached drawings in which.

DETAILED DESCRIPTION OF THE INVENTION

The present invention will be described below in more detail with reference to the attached drawings.

Figure 1:
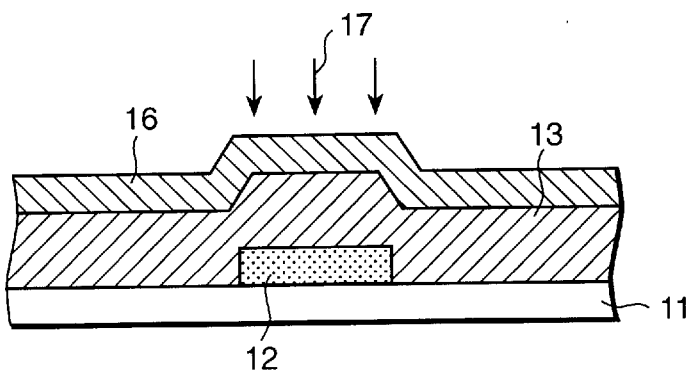
FIG. 1 to FIG. 3 are the cross-sectional views of the align key pattern regions for a red, green and a blue color pattern of the color filter according to the conventional method.
Figure 2:
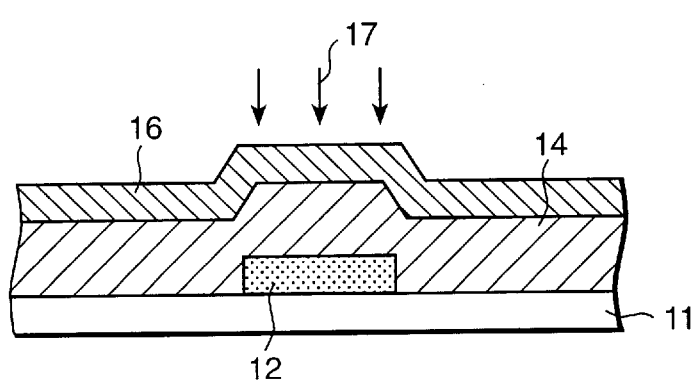
Figure 3:
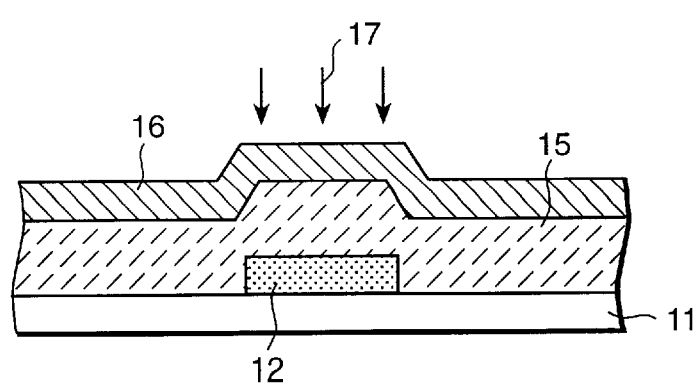
Figure 4:
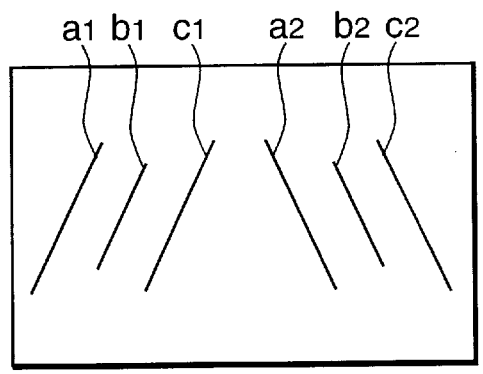
FIG. 4 is a plan view showing the align key pattern formed on the substrate and the align key pattern formed on a mask according to the conventional method.
Figure 5:
FIG. 5 shows the waveform diagrams detected from the light reflected from the align key pattern shown in FIG. 4.
Figure 6:
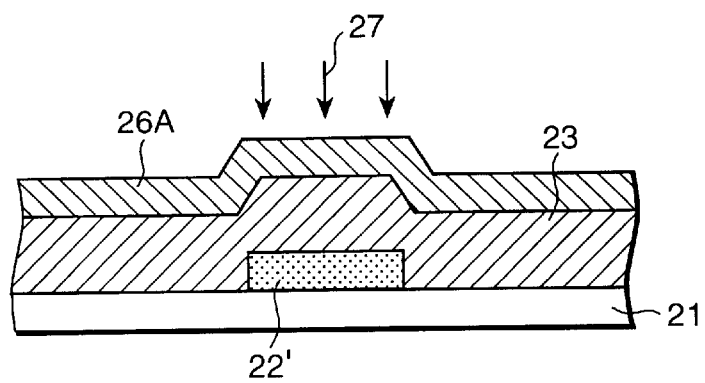
FIG. 6 to FIG. 8 show align key patterns and a method for forming the same in order to align the masks for exposing red, green and blue resist layers of the color filter according to one embodiment of the present invention.
Figure 7:
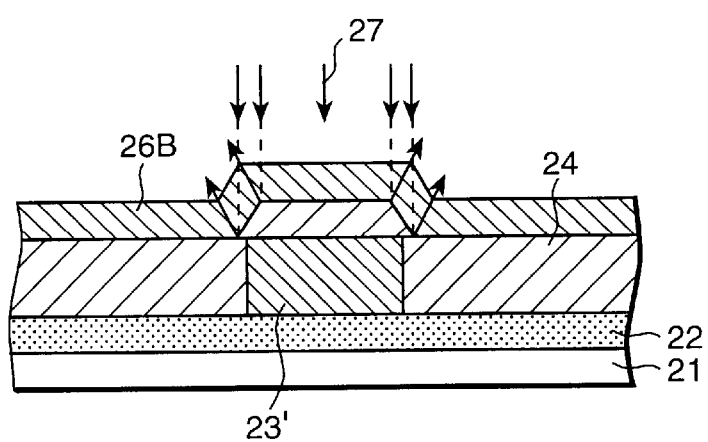
Figure 8:
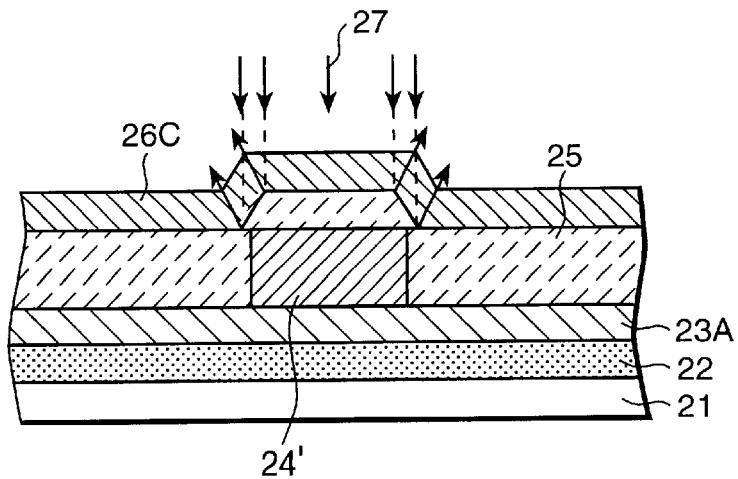

FIG. 6 to FIG. 8 show align key patterns and a method for forming the same in order to align the masks for red, green and blue resist layers of the color filter according to one embodiment of the present invention.

FIG. 6 illustrates steps of forming a first align key pattern 22' and aligning the mask for exposing the first resist layer. A light shielding material, such as chrome, is deposited to a thickness of 1,500 Å to form a light shielding (chrome) layer on a substrate 21. Then, the chrome layer is patterned via a conventional photolithography process to form first align key pattern 22'. At this time, a black matrix (reference numeral 22 of FIG. 7), is also formed on substrate 21. Then, a red resist is coated to a thickness of 1 to 2 $\mu$m (preferably approximately 1.6 $\mu$m) thereby forming a red resist layer 23, and a first anti-oxidative film 26A is formed to a thickness of 0.8 to 1.0 $\mu$m. The mask for exposing red resist layer 23 is auto-aligned by moving substrate 21 using first align key pattern 22' as a target for a laser beam 27 whose wavelength is about 633 nm. That is, laser beam 27 is irradiated onto first align key pattern 22', and then light reflected from first align key pattern 22' is detected to generate a signal. The above mask is aligned in accordance with the signal. Thereafter, red resist layer 23 is patterned via a conventional photolithography process, thereby forming a red resist pattern (not shown). First anti-oxidative film 26A is removed after the exposure step and before the development step of the photolithography process.

FIG. 7 illustrates the step of forming a second align key pattern 23' and aligning the mask for exposing a second resist layer. A second align key pattern (reference numeral 23' of FIG. 7) is formed in an area different from the area where first align key pattern 22' was formed. Second align key pattern 23' is formed with red resist (not chrome) in the location where an align key pattern is to be formed for aligning the mask for the green resist layer. This second align key pattern 23' is formed simultaneously with the red resist pattern.

As seen from FIG. 7, a black matrix 22 is formed on substrate 21, and second align key pattern 23' is formed on black matrix 22. A green resist is coated on the resultant structure, thereby forming a second (i.e., green) resist layer 24. A second anti-oxidative film 26B is formed on green resist layer 24 to a thickness of 0.6–1.0 $\mu$m. Then, laser beam 27 whose wavelength is approximately 600 nm–700 nm is irradiated onto second align key pattern 23'. Diffracted light from the inclined surface portion of green resist layer 24 is detected to generate a signal, and the mask for exposing green resist layer 24 is auto-aligned according to the above signal. Then, a green resist pattern (not shown) is formed by patterning green resist material layer 24 via a photolithography process. At this time, third align key pattern (reference numeral 24' of FIG. 8) is formed from green resist material where the align key for the blue resist layer is to be formed. Second anti-oxidative film 26B is removed after the exposure step and before the development step of the photolithography process.

FIG. 8 illustrates the step of aligning the mask for to exposing a third resist layer using third align key pattern 24'. The sectional view of FIG. 8 shows third align key pattern 24' which is formed in a region different from the regions where first and second align key patterns 22' and 23' (FIG. 6 and FIG. 7) were formed.

As seen from FIG. 8, the black matrix 22 is formed on substrate 21, the first resist pattern 23 is formed on the black matrix 22, and the third align key pattern 24' is formed on a layer of first resist material 23. A third resist layer, i.e., a blue resist layer 25, is formed by coating a blue resist material on the resultant structure. A third anti-oxidative film 26C is formed on blue resist layer 25 to a thickness of 0.6–1.0 $\mu$m. Then laser beam 27 whose wavelength is approximately 600 nm–700 nm is irradiated onto third align key pattern 24'. "Diffracted light from the inclined surface of blue resist layer 25 (where the step difference of third align key pattern 24' is formed) is detected to generate an alignment signal, and the mask for exposing blue resist layer 25 is auto-aligned according to the above signal. Then, a blue resist pattern (not shown) is formed by patterning blue resist layer 25 via a subsequent photolithography process.

Figure 9:
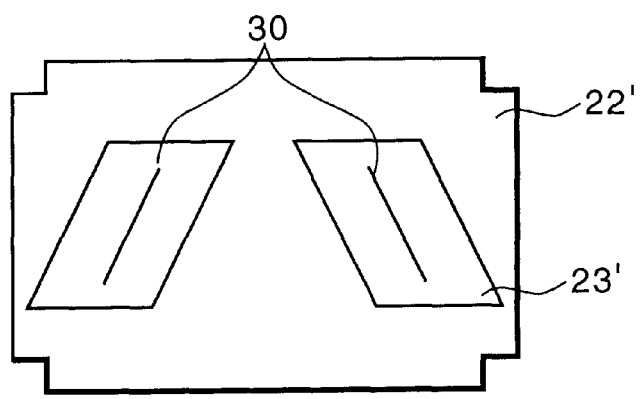
FIG. 9 is a plan diagram showing the align key pattern of the present invention and the align key pattern on a mask.
Figure 10:
FIG. 10 shows the waveform diagrams detected from the diffracted light of the align key pattern shown in FIG. 9.
Figure 11:
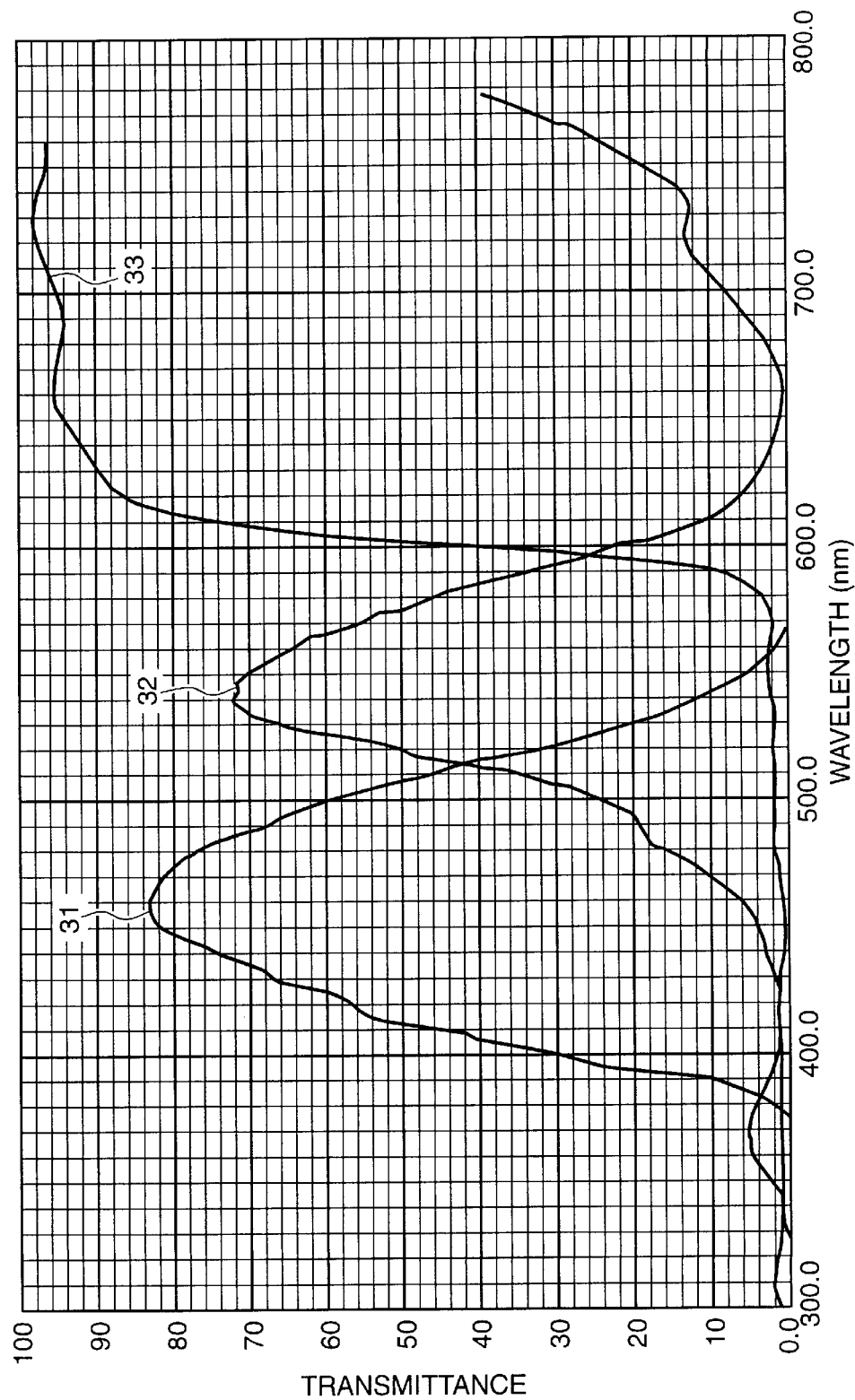
FIG. 11 is a graphical representation of the transmittance of blue, green and red resists as a function of laser beam wavelength.

FIG. 9 is a plan view of the second align key pattern 23' of the present invention shown in FIG. 7 and an align key patterns 30 on the mask. FIG. 10 shows the waveforms detected from the reflected light of the align key patterns shown in FIG. 9.

In FIG. 9, all the reference numerals indicate the same members as those of FIG. 7. Reference numeral 30 indicates the align key pattern formed on the mask. FIG. 10 shows waveform diagrams obtained from a group of align key patterns 23' and 30 of FIG. 9 using an oscilloscope when the mask is aligned. In FIG. 10, waveform (a) is obtained from a second align key pattern 23', and waveform (b) is obtained from an align key pattern 30 on the mask. As shown in FIG. 10, when the align key pattern is formed according to the method of the present invention, an auto-alignment of the mask can be performed easily since the accurate waveform diagram can be detected.

According to the method of the present invention for manufacturing a color filter, the align key pattern is formed using the above red and green resists so as to be used for aligning the green and blue resist layers, respectively. The presence of the second and third align key patterns 23', 24' causes a step change in height of the green and blue resist layers. The subsequent alignment detects light diffracted from the step-change region of the green and blue resist layers, rather than light reflected from the flat surface of the first align key patterns 22'. The signals shown in FIG. 10 can be obtained by detecting the diffracted light of the laser beam which is reflected from the inclined surface of the step change region of the green and blue resist layers, thereby enabling an auto-alignment of the mask for exposing the green and blue resist.

Accordingly, the alignment process is simplified, working time can be reduced, and the throughput is improved since the alignment process can be performed automatically.

It should be understood that although preferred embodiments of the invention have been described in detail above, many modifications and variations could be effected therein by one with ordinary skill in the art without departing from the spirit and scope of the invention as defined by the appended claims.

What is claimed is:

1. A method for forming a color filter comprising the steps of:

forming a light-shielding layer on a substrate;

patterning and forming said light-shielding layer with a first mask to produce a black matrix which comprises a first align key pattern;

forming a first colored resist layer over said black matrix;

exposing and developing said first colored resist layer to form a first color pattern;

forming a second colored resist layer over said substrate on which said first color pattern and said first align key pattern have been formed so that a first step-region of said second colored resist layer is formed which changes height over said first align key pattern;

detecting light reflected from said first step-region of said second colored resist layer and aligning a second mask;

exposing and developing said second colored resist layer to form a second color pattern which comprises a second align key pattern;

forming a third colored resist layer over said substrate on which said second color pattern and said second align key pattern have been formed so that a step-region of said third colored resist layer is formed which changes height over said second align key pattern;

detecting light reflected from said step-region of said third colored resist layer; and exposing and developing said third colored resist layer to form a third color pattern.

2. A method for forming a color filter according to claim 1, further comprising the steps of:

depositing a first anti-oxidative film on said first colored resist layer after forming said first colored resist layer and removing said first anti-oxidative film after forming said first color pattern;

depositing a second anti-oxidative film on said second colored resist layer after forming said second colored resist layer and removing said second anti-oxidative film after forming said second color pattern; and depositing a third anti-oxidative film on said third colored resist layer after forming said third colored resist layer and removing said third anti-oxidative film after forming said third color pattern.

3. A method for forming a color filter according to claim 2, wherein:

said first colored resist layer is a red resist layer;

said second colored resist layer is a green resist layer; and said third colored resist layer is a blue resist layer.

4. A method for forming a color filter comprising the steps of:

forming a light-shielding layer on a substrate;

patterning and forming said light-shielding layer with a first mask to produce a black matrix which comprises a first align key pattern on the substrate;

forming a first colored resist layer over said substrate on which said black matrix has been formed so that a first step-region of said first colored resist layer is formed which changes height over said first align key pattern;

detecting light reflected from said first step-region and aligning a second mask for exposing said first colored resist layer;

exposing and developing said first colored resist layer to form a first color pattern which comprises a second align key pattern;

forming a second colored resist layer over said substrate on which said second align key pattern has been formed so that a second step-region of said second colored resist layer is formed which changes height over said second align key pattern;

detecting light reflected from said second step-region and aligning a third mask for exposing said second colored resist layer;

exposing and developing said second colored resist layer to form a second color pattern which comprises a third align key pattern;

forming a third colored resist layer over said substrate on which said second color pattern has been formed so that a third step-region of said third colored resist layer is formed which changes height over said third align key pattern;

detecting light reflected from said third step-region and aligning a fourth mask for exposing said third colored resist layer; and exposing and developing said third colored resist layer to form a third color pattern.

5. A method for forming a color filter according to claim 4, further comprising the steps of:

depositing a first anti-oxidative film on said first colored resist layer after forming said first colored resist layer and removing said first anti-oxidative film after forming said first color pattern;

depositing a second anti-oxidative film on said second colored resist layer after forming said second colored resist layer and removing said second anti-oxidative film after forming said second color pattern; and depositing a third anti-oxidative film on said third colored resist layer after forming said third colored resist layer and removing said third anti-oxidative film after forming said third color pattern.

6. A method for forming a color filter according to claim 5, wherein:

said first colored resist layer is a red resist;

said second colored resist layer is a green resist; and said third colored resist layer is a blue resist.

* * * * *